United States Patent
Peterson (12)

(10) Patent No.: US 6,240,113 B1
(45) Date of Patent: May 29, 2001

(54) MICROLASER-BASED ELECTRO-OPTIC SYSTEM AND ASSOCIATED FABRICATION METHOD

(75) Inventor: Brian Lee Peterson, Charlotte, NC (US)

(73) Assignee: Litton Systems, Inc., Charlotte, NC (US)

( * ) Notice: Subject to any disclaimer, the term of this patent is extended or adjusted under 35 U.S.C. 154(b) by 0 days.

(21) Appl. No.: 09/365,316

(22) Filed: Jul. 30, 1999

Related U.S. Application Data

(63) Continuation-in-part of application No. 09/032,457, filed on Feb. 27, 1998, now Pat. No. 6,072,815.

(51) Int. Cl.⁷ .................................................. H01S 3/04
(52) U.S. Cl. ............................ 372/36; 372/34; 372/43; 372/50
(58) Field of Search ................................. 372/36, 34, 43, 372/50, 74, 81

(56) References Cited

U.S. PATENT DOCUMENTS

| | | | |
|---|---|---|---|
| 4,012,833 | 3/1977 | Akiyama | 29/591 |
| 4,338,577 | 7/1982 | Sato et al. | 372/36 |
| 4,411,057 | 10/1983 | Duda et al. | 372/36 X |
| 4,546,478 | 10/1985 | Shimizu et al. | 372/36 |
| 4,550,333 | 10/1985 | Ridder et al. | 372/36 X |
| 4,603,419 | 7/1986 | Shimizu et al. | 372/36 |
| 4,731,795 | 3/1988 | Clark et al. | 372/107 |
| 4,768,199 | 8/1988 | Heinen et al. | 372/36 |
| 4,860,304 | 8/1989 | Mooradian | 372/92 |
| 4,897,711 | 1/1990 | Blonder et al. | 372/36 X |
| 4,902,654 | 2/1990 | Aubert et al. | 501/117 |
| 4,904,036 | 2/1990 | Blonder | 372/50 X |
| 4,953,166 | 8/1990 | Mooradian | 372/21 |
| 4,962,504 | 10/1990 | Aubert et al. | 372/41 |
| 5,029,335 | 7/1991 | Fisher et al. | 372/36 |
| 5,113,404 | 5/1992 | Gaebe et al. | 372/36 |
| 5,115,445 | 5/1992 | Mooradian | 372/75 |
| 5,124,281 | 6/1992 | Ackerman et al. | 372/74 X |
| 5,156,999 | 10/1992 | Lee | 437/215 |
| 5,181,214 | 1/1993 | Berger et al. | 372/34 |

(List continued on next page.)

FOREIGN PATENT DOCUMENTS

| | | | |
|---|---|---|---|
| 0742613A1 | 11/1996 | (EP) | 372/50 X |
| 0742615A1 | 11/1996 | (EP) | 372/50 X |
| 0742616A1 | 11/1996 | (EP) | 372/50 X |

*Primary Examiner*—Brian Healy
(74) *Attorney, Agent, or Firm*—Alston & Bird LLP

(57) ABSTRACT

The electro-optic apparatus includes a primary heat sink and at least one submount mounted to the heat sink. The electro-optic apparatus also includes a pump source, such as a laser diode, mounted to a sidewall of the at least one submount. A secondary heat sink is also mounted to the at least one submount with an active gain medium mounted, in turn, to the secondary heat sink. Typically, the active gain medium is part of a microlaser that also includes a passive Q-switch. The active gain medium is mounted to the secondary heat sink such that the active gain medium extends in a cantilevered fashion from the secondary heat so as to overlie the pump source such that the output of the pump source pumps the active gain medium. By adjusting the position of the secondary heat sink to the at least one submount, the spacing between the pump source and the active gain medium can be precisely controlled, thereby also controlling the characteristics, such as the frequency, of the output signals emitted by the electro-optic apparatus. Advantageously, the at least one submount includes first and second submounts, both of which are mounted to the primary heat sink in a spaced apart relationship. By mounting the pump source and the active gain medium to different submounts, the electro-optic apparatus can more efficiently dissipate the heat generated during operation since separate thermal paths are established for the heat generated by the pump source and the active gain medium.

21 Claims, 4 Drawing Sheets

U.S. PATENT DOCUMENTS

| | | | |
|---|---|---|---|
| 5,233,580 | 8/1993 | Tanaka et al. | 372/36 X |
| 5,256,164 | 10/1993 | Mooradian | 372/99 |
| 5,264,392 | 11/1993 | Gaebe et al. | 437/209 |
| 5,265,113 | 11/1993 | Halldörsson et al. | 372/36 |
| 5,265,116 | 11/1993 | Mooradian | 372/75 |
| 5,295,146 | 3/1994 | Gavrilovic et al. | 372/41 |
| 5,319,653 | 6/1994 | Favennec et al. | 372/7 |
| 5,357,536 | 10/1994 | Andrews | 372/50 |
| 5,365,539 | 11/1994 | Mooradian | 372/75 |
| 5,394,413 | 2/1995 | Zayhowski | 372/10 |
| 5,402,437 | 3/1995 | Mooradian | 372/92 |
| 5,404,368 | 4/1995 | Makita et al. | 372/36 |
| 5,490,158 | 2/1996 | Mogi | 372/36 |
| 5,495,494 | 2/1996 | Molva et al. | 372/98 |
| 5,502,737 | 3/1996 | Chartier et al. | 372/11 |
| 5,574,740 | 11/1996 | Hargis et al. | 372/41 |
| 5,703,890 | 12/1997 | Thony et al. | 372/12 |
| 5,828,683 | 10/1998 | Freitas | 372/36 |
| 6,072,815 * | 6/2000 | Peterson | 372/36 |

\* cited by examiner

MICROLASER-BASED ELECTRO-OPTIC SYSTEM AND ASSOCIATED FABRICATION METHOD

RELATED APPLICATIONS

The present application is a continuation-in-part of U.S. patent application Ser. No. 09/032,457 filed Feb. 27, 1998, now U.S. Pat. No. 6,072,815, the contents of which are incorporated herein by reference.

FIELD OF THE INVENTION

The present invention relates generally to an electro-optic apparatus and an associated fabrication method and, more particularly, to an electro-optic apparatus having a microlaser that is capable of efficient heat dissipation as well as associated methods for fabricating the electro-optic apparatus.

BACKGROUND OF THE INVENTION

Modern electro-optic systems are being further miniaturized such that many electro-optic components are commonly mounted upon the same platform. The platform typically includes a submount which may be mounted upon a heat sink, such as a heat pump or the like. As such, the submount is generally formed of a thermally conductive material, such as a metal or semiconductor, in order to provide a path of relatively low thermal impedance from the various electro-optic components mounted upon the submount to the underlying heat sink.

In order to properly function, the various components of the electro-optic system must be precisely aligned. For example, an electro-optic system that includes a pump diode and an associated laser crystal or active gain medium requires that the pump diode be precisely aligned with the laser crystal as well as various other optical components, such as lenses, mirrors and the like. While this alignment has always been somewhat challenging, the alignment of the various components of an electro-optic system has become increasingly critical and increasingly difficult as the various components of the electro-optic systems have become even smaller.

With respect to an electro-optic system that includes a pump diode and an associated laser crystal or active gain medium, the pump diode and the laser crystal also must be precisely spaced from one another in order to produce the desired output, such as signals of the desired frequency. As such, even slight differences in the spacing between a pump diode and a laser crystal, such as submicron differences in the spacing, can cause the laser crystal to emit signals having a slightly different frequency. Since many applications are dependent upon receiving signals of a predetermined frequency, even small shifts or changes in the frequency of the laser crystal output can create problems downstream of the laser crystal.

Once the various electro-optic elements have been appropriately mounted upon the submount, the electro-optic system, including the submount and any underlying heat sink, is commonly mounted in an appropriate package, such as a TO-3 or TO-8 package. As is known to those skilled in the art, electro-optic packages, such as a TO-3 or TO-8 package, includes a number of conductive pins which must be electrically connected to appropriate leads of the electro-optic system in order to provide the necessary electrical energy to the electro-optic system. Even if the various electro-optic components are properly mounted upon the submount, the mounting of the electro-optic system within the package and the establishment of the electrical connections between the conductive pins of the package and respective leads of the electro-optic system can disadvantageously affect the performance of the electro-optic system. In particular, the mounting of the electro-optic system within a package generally requires handling of the electro-optic system which may expose the electro-optic system and, more particularly, the various electro-optic components, to static electricity and other deleterious conditions. In addition, conventional packaging techniques, including the establishment of appropriate electrical connections between the conductive pins of a package and the respective leads of the electro-optic system, may disadvantageously heat the various electro-optic components.

One of the advantages of an electro-optic system that includes a pump diode and an associated laser crystal is the relatively small size of the resulting device. Although small in size, the pump diode and the laser crystal generate significant amounts of heat once in operation. As such, the electro-optic system must provide for sufficient heat dissipation such that the various components, such as the pump diode and laser crystal, can be operated without overheating or otherwise being damaged. In particular, the electro-optic system should be designed such that the pump diode can remain in continuous wave (CW) operation so as to deliver the maximum pump energy to the laser crystal without overheating. Since a significant amount of heat is generated by the CW operation of a pump diode, particularly for the relatively small size of an electro-optic system that includes a pump diode and a laser crystal, conventional electro-optic systems have had difficulty in dissipating the thermal load as quickly and efficiently as required for some applications.

Although a variety of miniaturized electro-optic systems have been developed which include submounts and associated heat sinks for providing at least some heat dissipation for the various electro-optic components, a need still exists for improved techniques for precisely spacing the various electro-optic components of a miniaturized electro-optic system, such as a pump diode and a laser crystal or active gain medium. Moreover, a need still exists for increased heat dissipation for the various components of an electro-optic system so as to permit the electro-optic system to operate continuously without overheating or otherwise damaging the components.

SUMMARY OF THE INVENTION

An electro-optic apparatus and an associated fabrication method are therefore provided that permit an active gain medium to be precisely spaced from the pump source such that signals having the desired characteristics, such as the desired frequency, are emitted. Additionally, the electro-optic apparatus and the associated fabrication method of the present invention provide increased heat dissipation by separating the thermal loads of the pump source and the active gain medium such that the pump source can be operated continuously in order to maximize the pumping of the active gain medium without overheating or otherwise damaging the electro-optic apparatus.

The electro-optic apparatus includes a primary heat sink and at least one submount mounted to the heat sink. Preferably, each submount is formed of a thermally conductive, electrically insulating material in order to transfer heat from the components to the primary heat sink while providing electrical isolation for the components mounted upon the submount. The electro-optic apparatus of the present invention also includes a secondary heat sink mounted to the at least one submount with an active gain medium mounted, in turn, to the secondary heat sink. Typically, the active gain medium is part of a microlaser that also includes a passive Q-switch for regulating the output of the microlaser. According to the present invention, the active gain medium is mounted to the secondary heat sink such that the active gain medium extends in a cantilevered fashion from the secondary heat sink and from the at least one submount to which the secondary heat sink is mounted. The electro-optic apparatus of the present invention also includes a pump source, such as a laser diode, mounted to a sidewall of the at least one submount such that the output of the pump source pumps the active gain medium.

Advantageously, the at least one submount includes first and second submounts, both of which are mounted to the primary heat sink in a spaced apart relationship so as to define a gap therebetween. As such, the secondary heat sink is preferably mounted to the first submount such that the active gain medium extends over at least a portion of the gap defined between the first and second submounts. In addition, the pump source is preferably mounted to the sidewall of the second submount that faces the first submount. As such, the active gain medium preferably overlies the pump source such that the output of the pump source pumps the active gain medium.

In one advantageous embodiment, the first submount is U-shaped and has a pair of upstanding arms. In addition, the secondary heat sink of this embodiment is generally T-shaped so as to have a stem portion and a crossbar portion at one end of the stem portion. As such, the T-shaped secondary heat sink can be mounted to the first submount such that the stem portion is disposed between the pair of arms, thereby helping to position the active gain medium carried by the secondary heat sink.

By mounting the active gain medium to the secondary heat sink which, in turn, is mounted to the first submount and by separately mounting the pump source to the second submount, the heat generated by the active gain medium and the heat generated by the pump source pass through different submounts in order to reach the primary heat sink. By utilizing different submounts to transfer the thermal loads generated by the active gain medium and the pump source to the primary heat sink, the electro-optic apparatus of the present invention can more efficiently dissipate heat than conventional electro-optic systems that include laser diode pumped microlasers mounted upon a single submount. As such, the pump source of the electro-optic apparatus of the present invention can operate in CW mode in order to maximize the pump energy delivered to the active gain medium without overheating or otherwise damaging the components of the electro-optic apparatus.

By mounting the active gain medium and the pump source upon different submounts, the electro-optic system of the present invention also prevents the migration of epoxy from one component to the other which could disadvantageously alter the performance of the electro-optic system. For example, the electro-optic system of the present invention prevents epoxy that is used to secure the active gain medium from migrating to the emitting facet of the pump source which could contaminate the emitting facet and impair the performance of the pump source.

In addition to more efficiently dissipating the thermal load, the electro-optic apparatus of the present invention provides for the precise spacing of the active gain medium from the pump source in order to insure that the output of the electro-optic apparatus has the desired characteristics, such as the desired frequency. In this regard, after mounting the pump source to a sidewall of the second submount, the first and second submounts are mounted to the primary heat sink. The secondary heat sink with the active gain medium mounted thereto is then precisely positioned relative to the first submount such that the active gain medium overlies the pump source and the output of the pump source pumps the active gain medium. By adjusting the position of the secondary heat sink relative to the first submount, the spacing between the pump source and the active gain medium can be correspondingly adjusted. Since the signal characteristics, such as the frequency of the signals emitted by the active gain medium, vary based upon the spacing between the active gain medium and the pump source, the desired spacing can be selected by monitoring the output of the active gain medium as the position of the secondary heat sink relative to the first submount, and, in turn, as the spacing of the active gain medium from the pump source is varied. Once the desired position of the secondary heat sink relative to the first submount is determined, the secondary heat sink can be bonded to the first submount, such as by injecting epoxy between the secondary heat sink and the first submount or by soldering the secondary heat sink to the first submount. Once the secondary heat sink has been bonded to the first submount, the spacing between the active gain medium and the pump source is set such that the output signals have the desired characteristics. Additional components, such as a frequency doubling crystal, a fourth harmonic generator or the like, can then be mounted upon the first and second submounts such that heat can also be removed from these additional components via the primary heat sink, thereby providing temperature control and stability.

Accordingly, the electro-optic apparatus and associated fabrication method of the present invention provide more efficient heat dissipation by establishing separate thermal paths for the heat generated by the active gain medium and the heat generated by the pump source. As such, the electro-optic apparatus of the present invention can permit the pump source to operate in a CW mode so as to maximize the pumping of the active gain medium without overheating or otherwise damaging the components of the electro-optic apparatus. In addition, the electro-optic apparatus and the associated fabrication method permit the spacing between the active gain medium and the pump source to be precisely selected such that the output signals produced by the electro-optic apparatus have the desired characteristics, such as the desired frequency. As such, variations in the individual pump sources and active gain mediums of different electro-optic apparatuses can be accommodated by precisely adjusting the spacing therebetween in order to repeatably produce output signals having the desired characteristics.

DETAILED DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Figure 1:
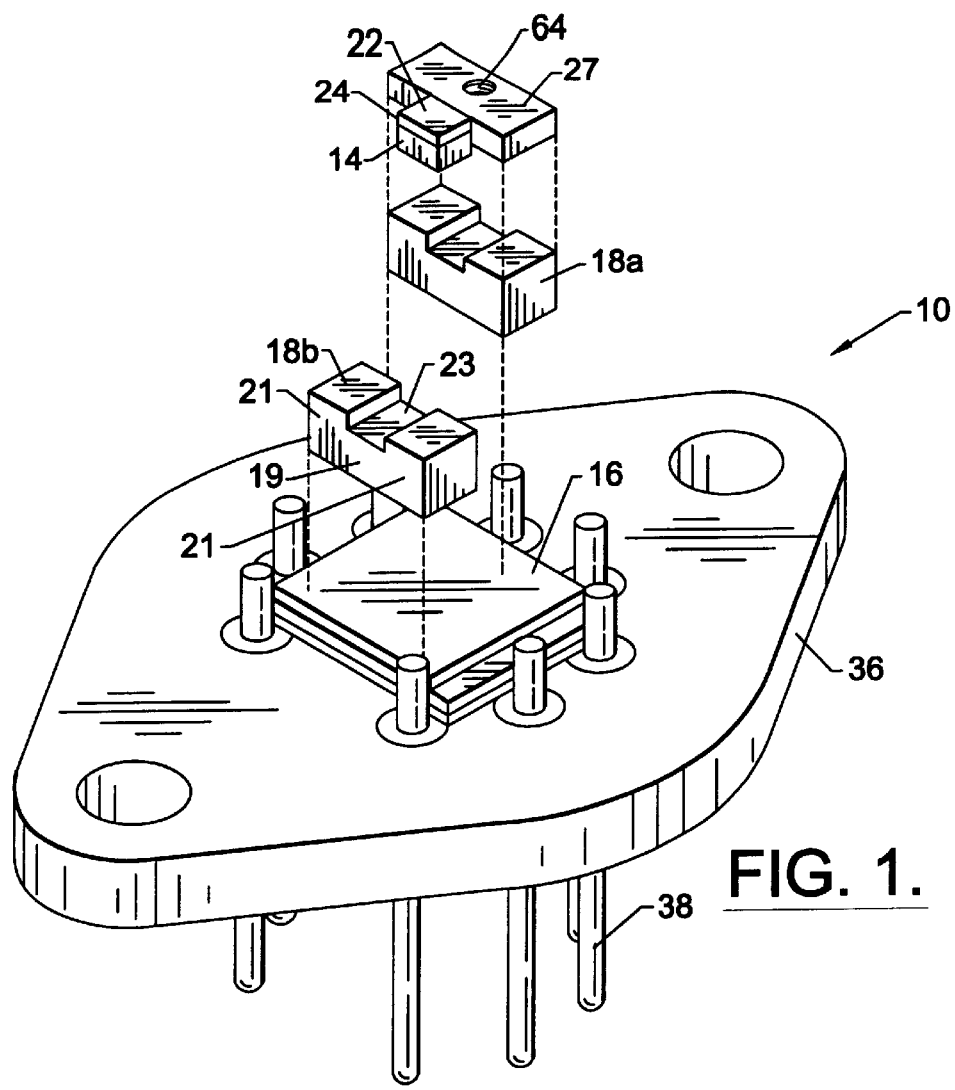
FIG. 1 is an exploded perspective view depicting an electro-optic system according to one advantageous embodiment of the present invention.
Figure 2:
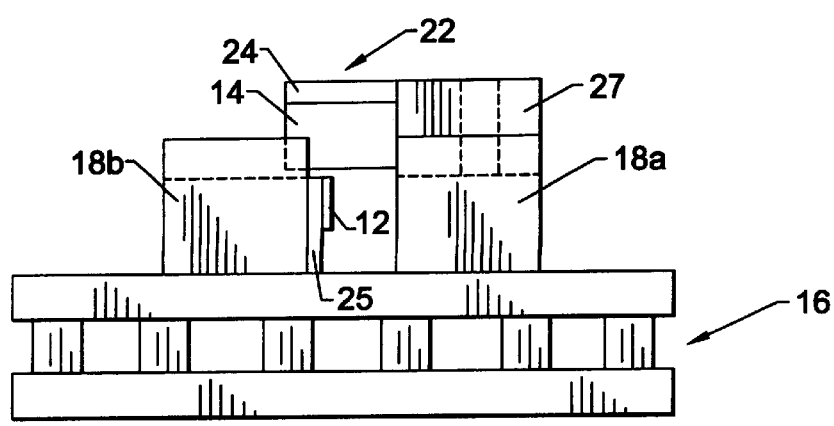
FIG. 2 is a side view of a portion of the electro-optic system of FIG. 1 following assembly including the primary heat sink, the first and second submounts, the secondary heat sink, the pump source and the microresonator cavity.
Figure 3:
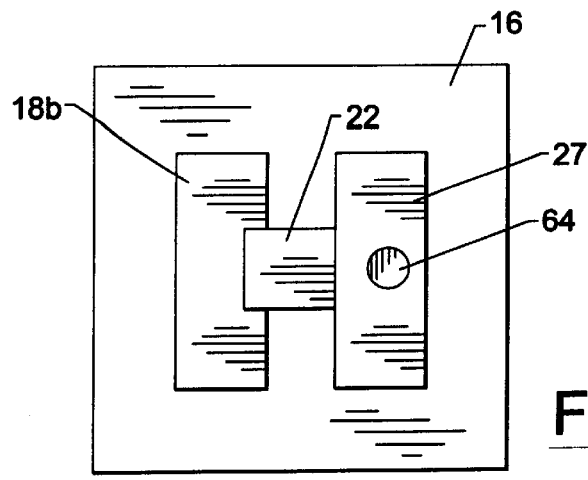
FIG. 3 is a top view of the electro-optic system of FIG. 2.

Referring now to FIGS. 1–3, an electro-optic system 10 according to one embodiment of the present invention is illustrated. Although the electro-optic system can include various components, the electro-optic system is particularly advantageous for supporting and aligning a microlaser system which requires precise alignment and spacing between a pump source 12, such as a laser diode, and a laser crystal or other active gain medium 14 and which also requires that the significant amounts of heat generated during its operation be effectively removed. As such, the electro-optic system will be hereinafter described in conjunction with a microlaser system.

As illustrated, the electro-optic system 10 includes a primary heat sink 16 and at least one submount 18 mounted upon the primary heat sink. It will be understood by those having skill in the art that an element or component that is described as being "on" or "mounted upon" another element may be either mounted directly on the underlying element or may merely overlie the other element with one or more intervening layers or elements being disposed between the elements. Although the primary heat sink can be a passive heat sink formed of thermally conductive material, such as a silver base plated with an alloy of gold and nickel, the primary heat sink can also be an active heat sink or heat pump such as a Peltier heat pump or other thermoelectric cooler. As shown in FIG. 2, for example, a conventional thermoelectric cooler includes one or more couples, typically formed of bismuth telluride, sandwiched between a pair of thermally conductive plates, such as aluminum oxide plates. As used herein, the term "heat sink" therefore includes not only heat sinks which cool a component by accepting waste heat, but also heat pumps which generate additional heat in order to warn a component.

Each submount 18 is formed of a thermally conductive material for providing a path of low thermal impedance to the primary heat sink 16. According to the present invention, the material which forms each submount is also electrically insulating so as to electrically isolate the various electro-optic components mounted upon the submount. Although each submount can be formed of a variety of thermally conductive, electrically insulating materials, each submount of one advantageous embodiment is formed of beryllium oxide, aluminum oxide or aluminum nitride which are both thermally conductive and electrically insulating.

As shown in FIGS. 1–3, the electro-optic system 10 of the present invention preferably includes first and second submounts 18a, 18b that are each mounted upon the primary heat sink 16. In this regard, the submounts are mounted upon the heat sink in a spaced apart relationship so as to define a gap therebetween. While the gap can be sized differently depending upon the application, the gap preferably has a width of about 1.1 mm +/−0.1 mm. As shown in FIGS. 1–3, the first and second submounts are identical in shape and size. While the use of identical submounts assists in the manufacture of the submounts, the submounts need not necessarily be of the same shape and size. In the illustrated embodiment, however, each submount is U-shaped so as to have a base portion 19 and a pair of upstanding arms 21 that extend outwardly from the base portion and define a recessed medial portion 23 therebetween.

The electro-optic system 10 of the present invention also includes a secondary heat sink 27. Typically, the secondary heat sink is a passive heat sink formed of a thermally conductive material, such as oxygen free, high conductivity (OFHC) copper plated with electrolytic gold and overplated with electrolytic nickel. The secondary heat sink is mounted to the first submount 18a, typically on the surface of the first submount opposite the primary heat sink 16. While the secondary heat sink can have a variety of shapes and sizes, the secondary heat sink preferably has a shape and size that substantially matches the shape and size of the surface of the first submount to which the secondary heat sink is mounted. Thus, in the illustrated embodiment in which the submount has a U-shape, the secondary heat sink preferably has a T-shape with an upstanding stem portion 29 and a crossbar portion 31 attached to one end of the stem portion. See FIG. 4. In the illustrated embodiment, the dimensions of the crossbar portion of the secondary heat sink are selected to be the same as the corresponding dimensions of the first submount. However, the secondary heat sink can be sized differently than the first submount without departing from the spirit and scope of the present invention. In addition, the stem portion of the secondary heat sink is preferably sized to fit snugly within the recessed medial portion 23 defined between the pair of upstanding arms 21 of the first U-shaped submount.

Figure 4:
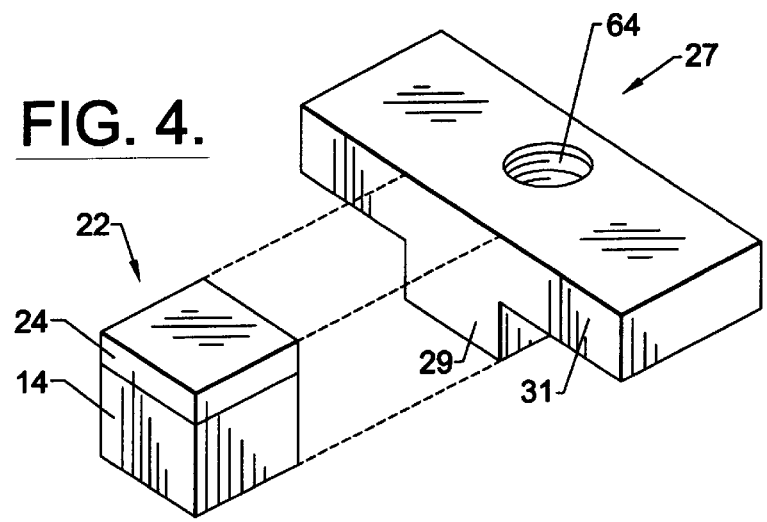
FIG. 4 is an exploded perspective view of a secondary heat sink and a microresonator cavity.

The electro-optic system 10 also includes an active gain medium 14 and, more preferably, a microresonator cavity 22 mounted to the secondary heat sink 27. In this regard, the microresonator cavity is preferably mounted to a sidewall of the secondary heat sink such that the microresonator cavity is held in a cantilevered fashion so as to at least partially overlie the gap defined between the first and second submounts 18a, 18b once the secondary heat sink which carries the microresonator cavity is mounted to the first submount. As shown in FIG. 3, the microresonator can extend completely across the gap such that a portion of the microresonator cavity is disposed within the recessed medial portion of the second submount. However, one microresonator cavity preferably does not contact the second submount, but is, instead, slightly spaced from the second submount such that no thermal path is established from the microresonator cavity to the second submount. As shown in FIG. 4, the microresonator cavity is typically mounted to both the stem portion 29 and a medial segment of the crossbar portion 31 of the T-shaped secondary heat sink. In addition, while the thickness of the microresonator cavity, such as 1.5 mm, is equal to the height of the T-shaped secondary heat sink in the illustrated embodiment, the microresonator cavity and the secondary heat sink can be sized differently, if so desired.

The microresonator cavity 22 preferably includes an active gain medium 14 and a saturable absorber or Q-switch 24 sandwiched between a pair of mirrors that define the resonant cavity. In this regard, one example of a suitable microresonator cavity is described by U.S. Pat. No. 5,394,413 to John J. Zayhowski which issued on Feb.28, 1995, the contents of which are incorporated in their entirety herein. According to one advantageous embodiment, the microresonator cavity includes an active gain medium formed of neodymium-doped yttrium aluminum garnet (YAG) and the saturable absorber formed of tetravalent chrome-doped YAG. Although the active gain medium of one advantageous embodiment is doped with approximately 1.6 atomic percent of neodymium, the active gain medium and the saturable absorber can include different dopant percentages without departing from the spirit and scope of the present invention. The microresonator cavity of this embodiment will emit laser pulses having a wavelength of 1.06 nanometers. As will be apparent to those skilled in the art, however, the active gain medium and the saturable absorber can be constructed of different materials in order to provide laser outputs having different properties, such as different wavelengths.

The electro-optic system 10 also preferably includes a pump source 12, such as a laser diode, mounted upon a sidewall of the second submount 18b that faces the first submount 18a. See FIG. 5. In particular, the laser diode of one advantageous embodiment is mounted to the base portion 19 of the second submount between the pair of upstanding arms 21 such that the laser diode underlies and is in alignment with the microresonator cavity 22 and, more particularly, the active gain medium 14 of the microresonator cavity. As such, the output of the laser diode will pump the active gain medium such that the microresonator cavity will emit a series of laser pulses. As described below, the laser diode is preferably precisely spaced, such as 20±5 microns, from the microresonator cavity. In addition, although the electro-optic system can include a variety of laser diodes, the laser diode of one advantageous embodiment is formed of gallium arsenide and provides 1.2 watts of pump power.

Figure 5:
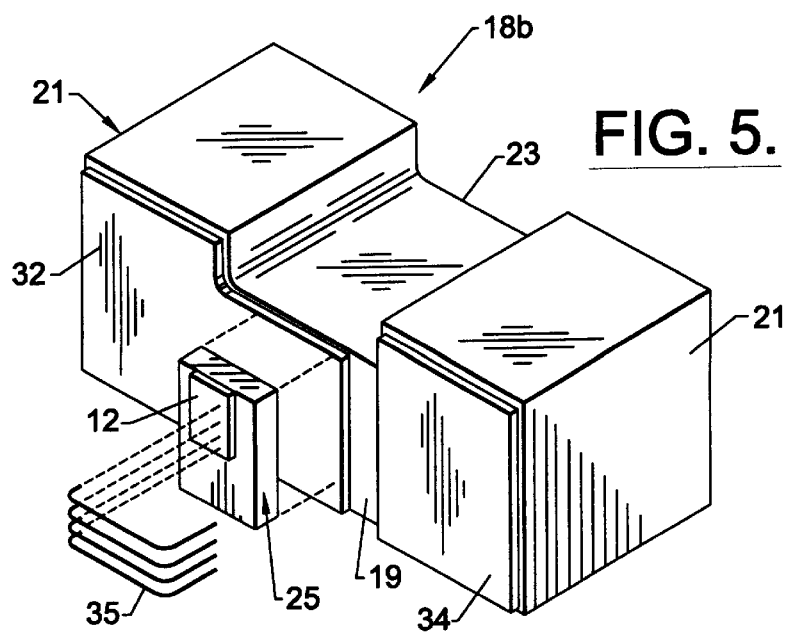
FIG. 5 is an exploded perspective view of a second submount including the first and second metallization layers, a thermal spreader and a laser diode.

As shown in FIG. 5, the laser diode 12 can be mounted upon a thermal spreader 25 formed of a thermally conductive material which, in turn, is mounted upon the sidewall of the second submount 18b. Although the laser diode can be mounted upon the thermal spreader in a number of fashions, the laser diode is typically mounted upon the thermal spreader proximate one end thereof and the thermal spreader is mounted to the sidewall of the second submount such that the end of the thermal spreader opposite the laser diode contacts the primary heat sink 16. For example, the thermal spreader may be formed of gold metallized diamond. In this regard, the diamond is typically a synthetic diamond that has been grown by a chemical vapor deposition process. Once grown, the diamond is generally polished and a gold coating is evaporatively deposited upon the diamond. The thermal spreader also generally has a larger footprint than the laser diode so as to effectively spread the heat generated by the laser diode over a broader area of the second submount.

The electro-optic system 10 also includes first and second metallization layers 32, 34 disposed upon different portions of the second submount 18b to thereby form a cathode and an anode, respectively. Although the metallization layers can be formed of a variety of electrically conductive materials, the first and second metallization layers of one advantageous embodiment are formed of diffusion bonded copper.

Although the first and second metallization layers 32, 34 can be disposed upon various portions of the second submount 18b, the first and second metallization layers of the illustrated embodiment are disposed upon different portions of the sidewall upon which the laser diode 12 is mounted, as shown in FIG. 5. In this regard, the first metallization layer is preferably disposed upon one of the upstanding arms 21 and the base portion 19 of the second submount such that the laser diode and, more particularly, the thermal spreader 25 is mounted upon the first metallization layer. In contrast, the second metallization layer is preferably disposed upon the other upstanding arm of the second submount and does not underlie the thermal spreader. Since the thermal spreader upon which the laser diode is mounted is metallized, electrical contact is established between the laser diode and the first metallization layer merely by mounting the thermal spreader upon the first metallization layers. As shown, wire bonds or ball bonds 35 can be established between the laser diode and the second metallization layer coating other portions of the sidewall of the second submount. By applying appropriate voltage and current to the metallization layers, the laser diode can be driven so as to produce an output which pumps the microresonator cavity 22 overlying the laser diode.

By mounting the active gain medium 14 to the secondary heat sink 27 which, in turn, is mounted to the first submount 18a and by separately mounting the pump source 12 to the second submount 18b, the heat generated by the active gain medium and the heat generated by the pump source pass through different submounts in order to reach the primary heat sink 16. By utilizing different submounts to transfer the thermal loads generated by the active gain medium and the pump source to the primary heat sink, the electro-optic apparatus 10 of the present invention can more efficiently dissipate heat than conventional electro-optic systems that include laser diode pumped microlasers mounted upon a single submount. As such, the pump source of the electro-optic apparatus of the present invention can operate in CW mode in order to maximize the pump energy delivered to the active gain medium without overheating or otherwise damaging the components of the electro-optic apparatus.

By mounting the active gain medium 14 and the pump source 12 upon different submounts, the electro-optic system 10 of the present invention also prevents the migration of epoxy from one component to the other which could disadvantageously alter the performance of the electro-optic system. For example, the electro-optic system of the present invention prevents epoxy that is used to secure the active gain medium from migrating to the emitting facet of the pump source which could contaminate the emitting facet and impair the performance of the pump source.

Figure 6:
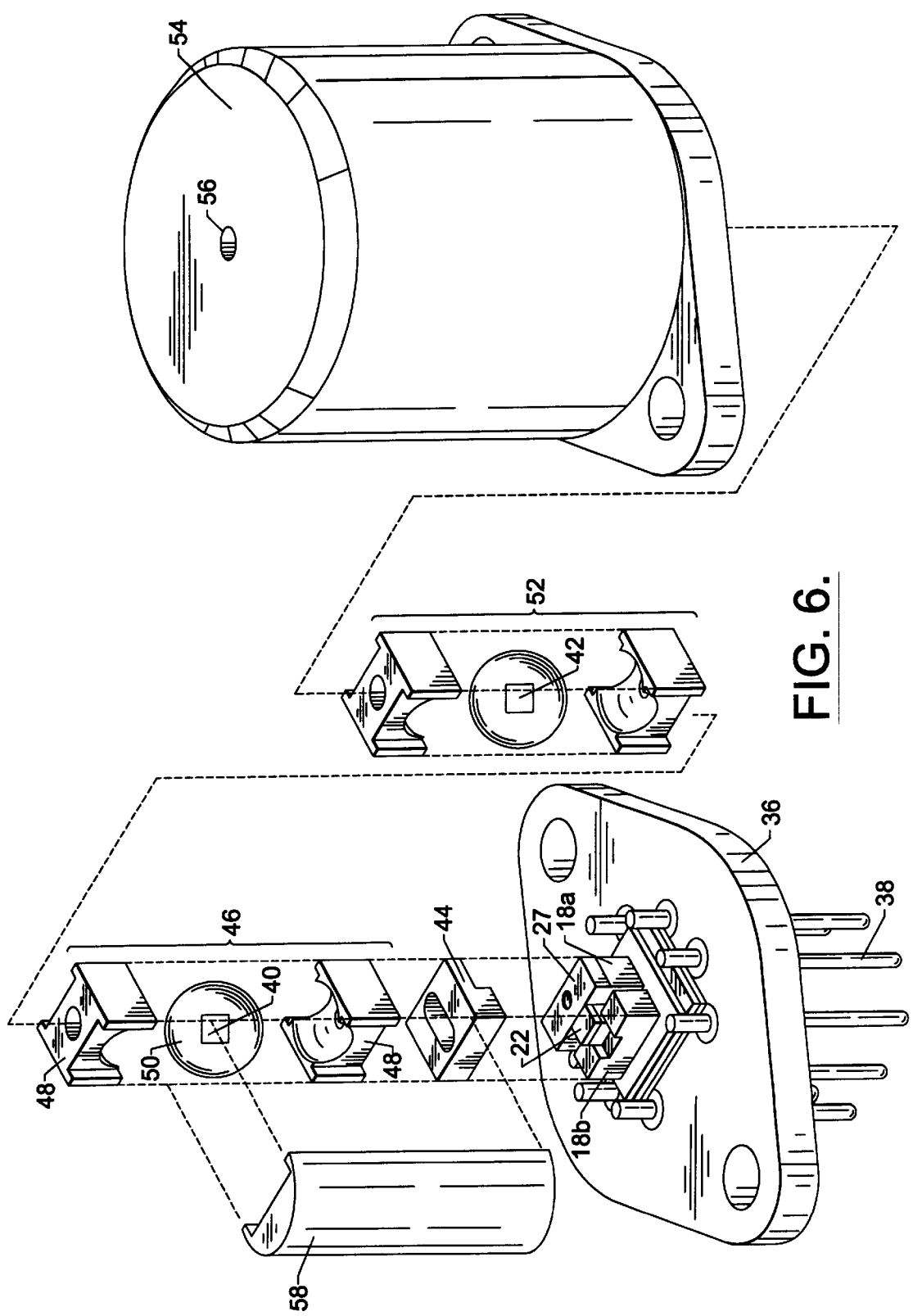
FIG. 6 is an exploded perspective view of an electro-optic system according to one advantageous embodiment of the present invention which includes a frequency doubling crystal and a fourth harmonic generator.

As shown in FIGS. 1 and 6, for example, the electro-optic system 10 is generally mounted within an electro-optic package 36, such as a TO-8 package or a TO-3 package, as will be described in more detail hereinafter. As shown in FIG. 1, however, the package generally includes a plurality of conductive pins 38 surrounding the electro-optic system. By establishing appropriate electrical connections between the conductive pins of the package and the respective leads of the electro-optic system, including the anode, the cathode and any electrical leads associated with the primary heat sink 16, the electro-optic system can be operated by appropriately driving the conductive pins of the electro-optic package.

Although not necessary for the practice of the present invention, the electro-optic system 10 can also include a variety of other electro-optic components downstream of the microresonator cavity 22 for appropriately processing the laser pulses emitted by the microresonator cavity. For example, the electro-optic system can include a frequency doubling crystal, typically formed of $KTiOPO_4$, i.e., KTP, a fourth harmonic generator, typically formed of BBO, an electro-optically tuned waveguide or one or more non-linear optic crystals.

In this regard, the embodiment of the electro-optic system 10 depicted in FIG. 6 includes both a frequency doubling crystal 40 and a fourth harmonic generator 42 downstream of the microresonator cavity 22. In this regard, a support base 44 typically formed of a metal, such as aluminum, is mounted with a thermally matched epoxy upon the exposed surfaces of the secondary heat sink 27 and the second submount 18b. As designed, the support base includes opposed first and second sides, wherein the first side is shaped to match the shape of the secondary heat sink and the second submount, while the second side is a planer surface. As such, the second surface of the support base provides a planar surface upon which other components can be mounted. As shown, the support base also defines a central aperture through with the signals emitted by the microresonator cavity are transmitted.

According to this embodiment, the frequency doubling crystal 40 and the associated mount 46 are then mounted upon the support base 44, such as with a thermally matched epoxy. Although the frequency doubling crystal can be mounted in a variety of manners, the mount of one embodiment is formed of invar and includes a pair of outer portions 48, each of which internally define a hemispherical recess. In addition, the mount of this embodiment includes a spherical portion 50 that holds the frequency doubling crystal and is adapted to be received within the hemispherical recesses defined by the outer portions of the mount. Although the outer portions are secured to one another and, in turn, to the support base, the spherical portion is capable of being rotated therein in order to properly align the frequency doubling crystal with the signals emitted by the microresonator cavity 22. In this regard, the outer portions of the mount also preferably define a hole opening into the hemispherical cavity through which the signals emitted by the microresonator cavity are transmitted.

As known to those skilled in the art, frequency doubling crystals, such as BBO crystals, require precise temperature control for proper operation. By mounting the frequency doubling crystal 40 and the associated mount 46 upon the support base 44 and, in turn, the first and second submounts 18a, 18b, however, the frequency doubling crystal is placed in thermal contact with the submounts and the primary heat sink 16. As such, the primary heat sink can also serve to remove heat generated by the frequency doubling crystal. In addition, since the primary heat sink of one advantageous embodiment is controlled so as to maintain the first and second submounts at a constant temperature, the frequency doubling crystal will also be maintained at the same constant temperature, thereby providing temperature control and stability to the frequency doubling crystal.

The electro-optic system 10 of this embodiment also includes a fourth harmonic generator 42 and an associated mount 52, mounted upon the mount 46 for the frequency doubling crystal 40, such as by means of a thermally matched epoxy. The mount for the fourth harmonic generator is preferably identical to the mount for the frequency doubling crystal such that the fourth harmonic generator can also be rotatably aligned with the signals originally emitted by the microresonator cavity 22 after the signals have been doubled in frequency by the frequency doubling crystal. As such, the signals emitted by the electro-optic system of this embodiment have a frequency four times that of the signals originally emitted by the microresonator cavity. By way of example, an electro-optic system that includes a microresonator cavity adapted to emit signals having a wavelength of 1.06 microns will therefore produce an output having a wavelength of 266 nanometers.

Once the various components have been appropriately aligned and secured, a top cap 54 is preferably placed over the components and hermetically sealed to the base or header of the electro-optic package 36. Typically, the top cap is also formed of a metal, such as aluminum, and defines an anti-reflection coated window 56 through which the signals emitted by the microresonator cavity 22 are transmitted, albeit at a greater frequency. In order to improve the mechanical stability of the components stacked within the electro-optic package, the electro-optic system 10 can also include a C-shaped support bracket 58 that partially surrounds and supports the electro-optic components. Preferably, support bracket is sized such that the interior of the support bracket fits snugly about the electro-optic components while the exterior of the support bracket snugly fits within the top cap that is mounted thereover. While the C-shaped bracket can be formed of a variety of materials, the C-shaped bracket is formed of aluminum in one embodiment.

While the window 56 defined by the top cap 54 is preferably anti-reflection coated, a small fraction of the signals incident upon the window will not propagate therethrough, but will undergo Fresnel reflection. In order to obtain a measure of the output of the electro-optic system 10 and/or an indication of the time at which an output pulse was emitted, the electro-optic system can also include a photodiode for receiving and providing a measure of the reflected light. In this regard, the photodiode can be mounted upon an upper surface of the mount 52 for the fourth harmonic generator 42 so as to receive the reflected light. The output of the photodiode can then be transmitted to an external controller for review and analysis by the system operator.

Further, the electro-optic system 10 can include a temperature sensor for monitoring the temperature of the first and second submounts 18a, 18b. In one embodiment in which the primary heat sink 16 is a thermoelectric cooler, the temperature sensor is preferably electrically connected to the thermoelectric cooler and to a controller such that the cooling provided by the thermoelectric cooler can be adjusted by the controller based upon the temperature of the submounts. In this regard, the temperature sensor and the thermoelectric cooler are preferably designed such that the thermoelectric cooler maintains the submounts at a relatively constant temperature. See U.S. patent application Ser. No. 09/032,457 for a more detailed discussion of the temperature control of the submount assembly, the contents of which are incorporated herein.

Although the electro-optic system 10 illustrated in FIGS. 1–3 includes a single primary heat sink 16 or, more precisely, a single Peltier heat pump, the electro-optic system can be segmented and can correspondingly have a plurality of heat sinks, one of which is associated with each segment. For example, the primary heat sink can include a first heat sink which supports the first submount 18a, the secondary heat sink 27 and the microresonator cavity 22, and a second heat sink which supports the second submount 18b and the laser diode 12. As such, each heat sink can be individually controlled, such as by means of a temperature sensor and a controller, to maintain the temperature as desired for the components mounted thereon. For example, a controller can receive signals from first and second temperature sensors that are representative of the temperature of the first and second submounts, respectively. The controller can then apply appropriate voltages to the leads of the first and second Peltier heat pumps in order to individually control the temperature of each of the submounts. See U.S. patent application Ser. No. 09/032,457, which provides a more detailed discussion of the heat sink control, the contents of which have been incorporated herein.

By way of example, since the laser diode 12 generally generates more heat than the other components, the heat pump associated with the second submount 18b upon which the laser diode is mounted will generally remove more heat than the heat pump associated with the first submount 18a. In order to maintain the wavelength of the signals emitted by the laser diode within the central portion of the pump band of the active gain medium 14, for example, the second submount is preferably cooled such that the temperature of the laser diode remains relatively constant since the wavelength of the signals emitted by the laser will otherwise vary if the temperature of the laser diode fluctuates. Additionally, the heat pump associated with the first submount can cool or heat the first submount such that the microresonator cavity 22 and any other components are maintained at a temperature that enhances their operating efficiency.

The present invention also provides an advantageous method for packaging the electro-optic system 10. According to this aspect of the present invention, the primary heat sink 16, such as a Peltier heat pump, is initially mounted upon a support surface of a package 36, such as a TO-3 or TO-8 package, by means of a thermally matched epoxy, such as aluminum oxide filled or silver filled epoxies, or by means of a solder, such as 118° C. indium solder. The first and second submounts 18a, 18b can thereafter be mounted upon the primary heat sink, also typically by means of a thermally matched epoxy or a solder, such as indium solder. Although the metallization layers 32, 34 are typically diffusion bonded onto the second submount and the thermal spreader 25 and the laser diode 12 are mounted upon the second submount prior to adhering the second submount to the primary heat sink, the secondary heat sink 27 and the microresonator cavity 22 are preferably not yet mounted to the first submount at the time of its mounting to the primary heat sink.

As shown in FIGS. 1 and 6, the package 36 includes a plurality of conductive pins 38 which extend through the base of the package and which surround the support surface of the package. Once the primary heat sink 16 and the first and second submounts 18a, 18b have been mounted, electrical connections are then established between the conductive pins of the package and respective leads of the electro-optic system 10. For example, electrical connections are established between the conductive pins of the package and the anode, the cathode and respective leads of the thermoelectric cooler. In addition, electrical connections can be made between the conductive pins and a temperature sensor, such as a thermister, mounted upon the primary heat sink. By analyzing the signals from the temperature sensor, an external controller can appropriately drive the thermoelectric cooler so as to cool the various components, as described above.

Figure 7:
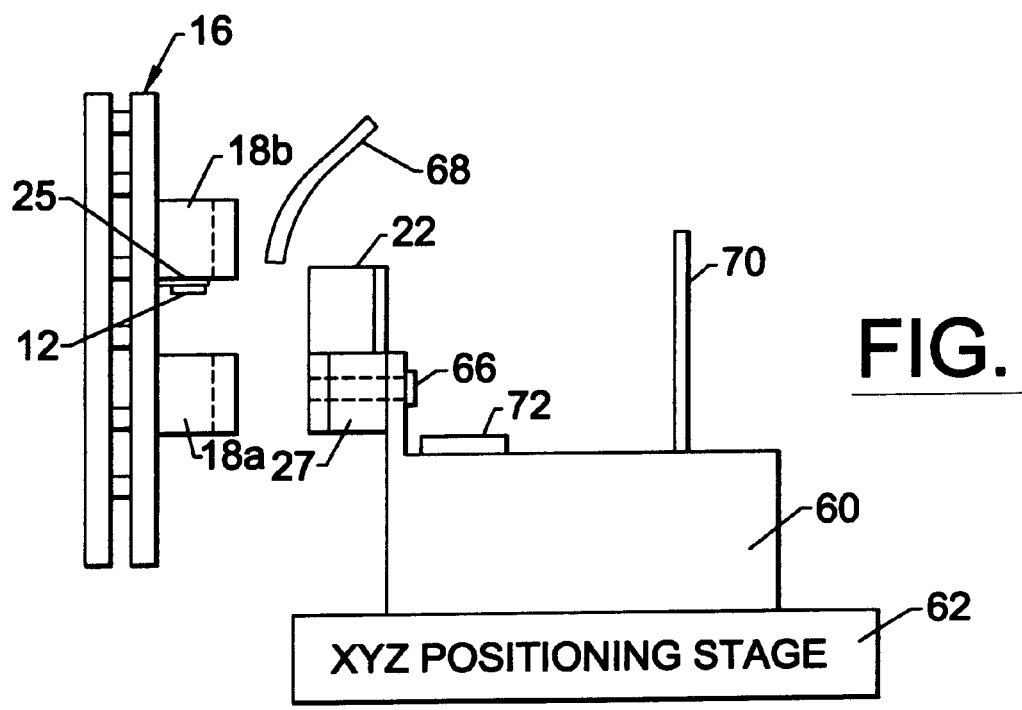
FIG. 7 is a perspective view illustrating one technique for adjusting the spacing of the secondary heat sink from the first submount and, in turn, the spacing of the microresonator cavity from the laser diode.

Once the primary heat sink 16 and the first and second submounts 18a, 18b have been mounted upon the support surface of the package 36 and appropriate electrical connections have been established, the secondary heat sink 27 which carries the microresonator cavity 22 can be mounted upon the first submount. In this regard, after the microresonator cavity has been bonded to the sidewall of the secondary heat sink, such as by means of a thermally matched epoxy or by means of a solder, the secondary heat sink is mounted to a fixture 60 as shown in FIG. 7. The fixture, in turn, is held by a precision XYZ positioning stage 62, such as the ULTRAlign Series 461 or 462 of XYZ positioning stages supplied by Newport Corporation of Irvine, Calif. In this regard, the secondary heat sink preferably defines an aperture 64 extending therethrough, such as through both the crossbar portion 31 and the stem portion 29. While not illustrated, the hole defined by the secondary heat sink is finely threaded for receiving a correspondingly threaded member. As such, the threaded member 66 can be threadably inserted through a similar aperture defined by the fixture and through the hole defined by the secondary heat sink so as to secure the secondary heat sink to the fixture. See FIG. 7.

The XYZ positioning stage 62 then positions the secondary heat sink 27 upon the first submount 18a such that the stem portion 29 of the T-shaped secondary heat sink fits within the recessed medial portion 23 defined between the upstanding arms 21 of the first U-shaped submount. In order to gauge the general position of the secondary heat sink relative to the first submount, the operator can view the spacing between the secondary heat sink and the first submount, as well as the spacing between the microresonator cavity 22 and the laser diode 12 upon a display by means of a fiberscope, shown generically at 68 in FIG. 7. Once the secondary heat sink has been generally positioned with respect to the first submount, the position of the secondary heat sink is then fine tuned so as to obtain the precise spacing of the microresonator cavity from the laser diode in order to produce signals having the desired characteristics, such as the desired frequency and wavelength. In order to select the desired spacing between the laser diode and the microresonator cavity, power is preferably applied to the laser diode during the process of positioning the secondary heat sink upon the first submount such that the laser diode pumps the active gain medium 14 and the microresonator cavity, in turn, emits a series of pulses. By monitoring the frequency and wavelength of the pulses, such as with a fast photodiode 70 and an associated oscilloscope, the position of the secondary heat sink with respect to the first submount can be adjusted until the output pulses have the desired characteristics, such as the desired frequency and wavelength.

Thereafter, the secondary heat sink 27 can be bonded to the first submount 18a, such as by soldering the secondary heat sink to the first submount with an indium solder, for example, or by injecting an epoxy, such as a thermally matched epoxy, between the secondary heat sink and the first submount. In one embodiment, the desired position of the secondary heat sink is measured, such as by an optical comparator. Once the desired position has been identified, the XYZ positioning stage 62 can slightly retract the secondary heat sink to correspondingly increase the spacing between the secondary heat sink and the first submount. Epoxy can then be injected more readily into the space between the secondary heat sink and the first submount. Once the epoxy has been injected, the XYX positioning stage can again move the secondary heat sink to the desired position as measured by the optical comparator prior to curing the epoxy.

In order to hasten the curing process, a heater 72 can be disposed upon the fixture 60. Once the secondary heat sink 27 has been repositioned to the desired position, the heater can be activated to heat the fixture. Since the fixture is typically constructed of a thermally conductive material, such as aluminum, the heater therefore also heats the secondary heat sink so as to cure the epoxy. Once the epoxy is cured, the heater is deactivated and the threaded member 66 can be removed from the secondary heat sink such that the electro-optic system 10 can be removed from the fixture.

By permitting the spacing between the pump source 12 and the active gain medium 14 to be precisely selected, the electro-optic apparatus 10 and the associated fabrication method of the present invention insure that the output signals produced by the electro-optic apparatus have the desired characteristics, such as the desired frequency. As such, variations in the individual pump sources and active gain mediums of different electro-optic apparatuses can be accommodated by precisely adjusting the spacing therebetween in order to repeatably produce output signals having the desired characteristics.

If the electro-optic system 10 is to include other components, such as a frequency doubling crystal 40 and a fourth harmonic generator 42, in order to appropriately process the signals emitted by the microresonator cavity 22, the other components are then mounted upon the submount assembly including the first and second submounts 18a, 18b and the secondary heat sink 27. In instances in which the electro-optic system includes a photodiode to measure the signals Fresnel reflected from the window 54 defined by the top cap 52, electrical connections between the conductive pins and the photodiode are also established before mounting the top cap to complete the electro-optic package 36.

By mounting at least some of the components, including the microresonator cavity 22, upon the submounts 18 after the primary heat sink 16 and the first and second submounts 18a, 18b have already been mounted upon the support surface of the package 36, the method of the present invention provides a number of advantages. In particular, the fabrication method of the present invention reduces the handling of the various components, thereby reducing the exposure of the components to static electricity and other deleterious conditions. In addition, the packaging technique of the present invention limits heating of a number of electro-optic components, including the microresonator cavity, that could deleteriously affect the operation and/or lifetime of the other electro-optic components.

Regardless of the fabrication technique, the electro-optic apparatus 10 of the present invention provides more efficient heat dissipation by establishing separate thermal paths for the heat generated by the microresonator cavity 22 and the heat generated by the pump source 12. As such, the electro-optic apparatus of the present invention can permit the pump source to operate in a CW mode so as to maximize the pumping of the active gain medium 14 without overheating or otherwise damaging the components of the electro-optic apparatus. By mounting the pump source and the microresonator cavity upon separate submounts 18, the electro-optic system of the present invention also prevents epoxy from migrating from one component to the other which could disadvantageously alter the performance of the electro-optic system, such as by at least partially covering the emitting facet of the pump source, for example.

In the drawings and the specification, there has been set forth a preferred embodiment of the invention and, although specific terms are employed, the terms are used in a generic and descriptive sense only and not for purpose of limitation, the scope of the invention being set forth in the following claims.

That which is claimed is:

1. An electro-optic apparatus comprising:
   first and second submounts spaced apart from one another to define a gap therebetween;
   a secondary heat sink mounted to said first submount;
   a pump source mounted to a sidewall of said second submount that faces said first submount; and
   an active gain medium mounted to said secondary heat sink such that said active gain medium extends over at least a portion of the gap defined between said first and second submounts such that an output of said pump source pumps said active gain medium.

2. An electro-optic apparatus according to claim 1 wherein said first and second submounts comprise a thermally conductive, electrically insulating material.

3. An electro-optic apparatus according to claim 1 further comprising a primary heat sink, wherein said first and second submounts are mounted to said primary heat sink in a spaced apart relationship.

4. An electro-optic apparatus according to claim 1 further comprising a microlaser mounted to said secondary beat sink, wherein said microlaser comprises said active gain medium and a passive Q-switch for regulating an output of said microlaser.

5. An electro-optic apparatus according to claim 1 further comprising a frequency doubling crystal disposed in thermal contact with said first and second submounts.

6. An electro-optic apparatus comprising:
   a primary heat sink;
   at least one submount mounted to said primary heat sink;
   a secondary heat sink mounted to said at least one submount;
   an active gain medium mounted to said secondary heat sink such that said active gain medium extends in a cantilevered fashion from said secondary heat sink and said at least one submount to which said secondary heat sink is mounted; and
   a pump source mounted to a sidewall of said at least one submount such that an output of said pump source pumps said active gain medium.

7. An electro-optic apparatus according to claim 5 wherein said at least one submount comprises first and second submounts mounted to said primary heat sink in a spaced apart relationship to define a gap therebetween, wherein said secondary heat sink is mounted to said first submount such that said active gain medium extends over at least a portion of the gap defined between said first and second submounts, and wherein said pump source is mounted to the sidewall of said second submount that faces said first submount.

8. An electro-optic apparatus according to claim 5 wherein said at least one submount comprises a thermally conductive, electrically insulating material.

9. An electro-optic apparatus according to claim 5 further comprising a microlaser mounted to said secondary heat sink, wherein said microlaser comprises said active gain medium and a passive Q-switch for regulating an output of said microlaser.

10. An electro-optic apparatus according to claim 6 further comprising a frequency doubling crystal disposed in thermal contact with said primary heat sink and said at least one submount.

11. An electro-optic apparatus comprising:
   a first U-shaped submount having a pair of arms;
   a T-shaped secondary heat sink having a stem portion and a crossbar portion at one end of the stem portion, said secondary heat sink mounted to said submount such that the stem portion is disposed between said pair of arms;
   an active gain medium mounted to said secondary heat sink; and
   a pump source disposed in alignment with said active gain medium such that an output of said pump source pumps said active gain medium.

12. An electro-optic apparatus according to claim 11 further comprising a second submount wherein said pump source is mounted to a sidewall of said second submount.

13. An electro-optic apparatus according to claim 12 further comprising a primary heat sink, wherein said first and second submounts are mounted to said primary heat sink in a spaced apart relationship so as to define a gap therebetween.

14. An electro-optic apparatus according to claim 12 wherein said first and second submounts comprise a thermally conductive, electrically insulating material.

15. An electro-optic apparatus according to claim 11 wherein said secondary heat sink defines a hole therethrough.

16. An electro-optic apparatus according to claim 11 further comprising a microlaser mounted to said secondary heat sink, wherein said microlaser comprises said active gain medium and a passive Q-switch for regulating an output of said microlaser.

17. A method for assembling an electro-optic apparatus comprising:

mounting at least one submount to a primary heat sink;

mounting a pump source to a sidewall of the at least one submount;

mounting an active gain medium to a secondary heat sink;

positioning the secondary heat sink relative to the at least one submount such that an output of the pump source pumps the active gain medium carried by the secondary heat sink;

adjusting the position of the secondary heat sink relative to the at least one submount to thereby select the spacing between the pump source and the active gain medium; and bonding the secondary heat sink to the at least one submount once the spacing between the pump source and the active gain medium is selected.

18. A method according to claim 17 wherein mounting at least one submount to the primary heat sink comprises mounting first and second submounts to the primary heat sink in a spaced apart relationship so as to define a gap therebetween, wherein mounting a pump source to the sidewall of the at least one submount comprises mounting the pump source to the sidewall of the second submount, and wherein positioning the secondary heat sink relative to the at least one submount comprises positioning the secondary heat sink relative to the first submount such that the active gain medium overlies the pump source.

19. A method according to claim 17 further comprising monitoring an output of the active gain medium while adjusting the position of the secondary heat sink to the at least one submount.

20. A method according to claim 17 wherein bonding the secondary heat sink to the at least one submount comprises injecting epoxy between the secondary heat sink and the at least one submount.

21. A method according to claim 17 wherein bonding the secondary heat sink to the at least one submount comprises soldering the secondary heat sink to the at least one submount.

* * * * *